United States Patent
Paugam et al.

(10) Patent No.: US 10,502,380 B2
(45) Date of Patent: Dec. 10, 2019

(54) LIGHTING DEVICE FOR A MOTOR VEHICLE

(71) Applicant: VALEO VISION, Bobigny (FR)

(72) Inventors: Stephane Paugam, Angers (FR); Julien Cesaire, Angers (FR); Benoit Milaret, Angers (FR); Gilles Nodet, Angers (FR); Carlos Bedoya, Angers (FR); Remi Blot, Angers (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 16/119,059

(22) Filed: Aug. 31, 2018

(65) Prior Publication Data

US 2019/0063707 A1 Feb. 28, 2019

(30) Foreign Application Priority Data

Aug. 31, 2017 (FR) ..................... 17 58031

(51) Int. Cl.
| | |
|---|---|
| *F21S 41/19* | (2018.01) |
| *H05K 7/20* | (2006.01) |
| *F21S 41/141* | (2018.01) |
| *H05K 5/02* | (2006.01) |
| *H01R 13/60* | (2006.01) |
| *H05K 5/00* | (2006.01) |
| *B60Q 1/00* | (2006.01) |

(52) U.S. Cl.
CPC ............ *F21S 41/192* (2018.01); *B60Q 1/007* (2013.01); *F21S 41/141* (2018.01); *H01R 13/60* (2013.01); *H05K 5/0069* (2013.01); *H05K 5/0247* (2013.01); *H05K 7/20854* (2013.01)

(58) Field of Classification Search
CPC ...... H01R 13/60; F21S 41/192; H05K 5/0247
See application file for complete search history.

(56) References Cited

U.S. PATENT DOCUMENTS

| 5,188,444 A * | 2/1993 | Makita ................. B60Q 1/0041 362/265 |
| 5,653,528 A * | 8/1997 | Schmidt ................. B60Q 1/007 362/549 |

(Continued)

FOREIGN PATENT DOCUMENTS

JP 2003-142199 5/2003

OTHER PUBLICATIONS

French Preliminary Search Report dated Apr. 16, 2018 in French Application 17 58031 filed Aug. 31, 2017 (with English Translation of Categories of Cited Documents).

*Primary Examiner* — Tho D Ta
(74) *Attorney, Agent, or Firm* — Oblon, McClelland, Maier & Neustadt, L.L.P.

(57) ABSTRACT

A lighting device for a motor vehicle, the lighting device including: a housing; a light module arranged inside the housing; a control device designed to control the electrical supply to the light module, including a female connector mounted outside the housing; a connection harness connected to the light module and including a male connector designed to be connected to the female connector of the control device so as to connect the control device electrically to the light module, characterized in that the housing includes: an orifice for the passage of the connection harness from the inside to the outside of the housing; and at least two ribs defining a receiver to receive and lock the male connector in position on the housing.

20 Claims, 7 Drawing Sheets

(56) References Cited

U.S. PATENT DOCUMENTS

| | | | | |
|---|---|---|---|---|
| 5,700,079 A | * | 12/1997 | Woerner | B60Q 1/007 |
| | | | | 362/496 |
| 6,967,288 B2 | * | 11/2005 | Ohsawa | B60Q 1/0088 |
| | | | | 174/104 |
| 8,235,553 B2 | * | 8/2012 | Minami | B60Q 1/0094 |
| | | | | 362/265 |

* cited by examiner

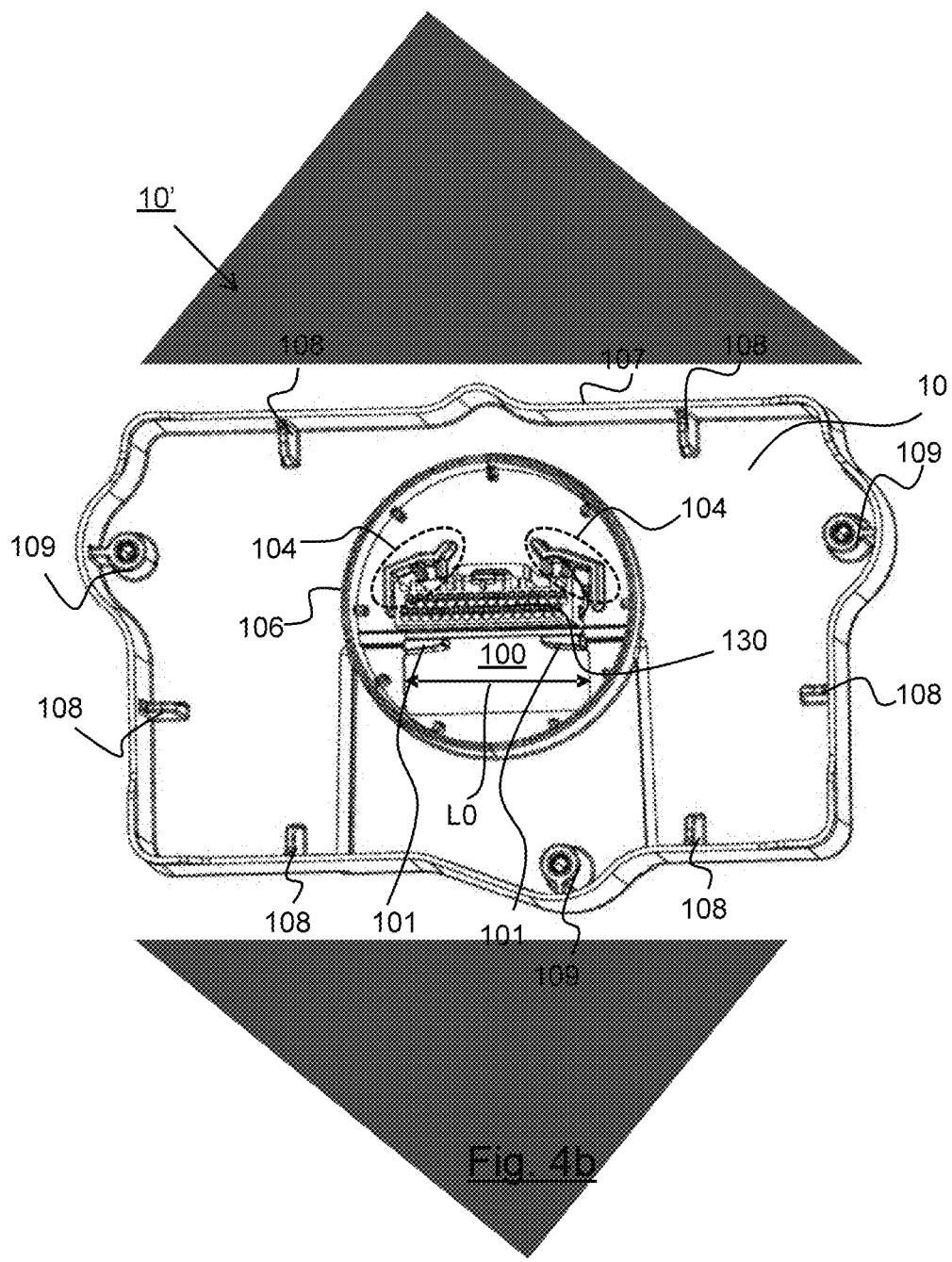

LIGHTING DEVICE FOR A MOTOR VEHICLE

TECHNICAL FIELD OF THE INVENTION

The present invention relates to a lighting device for a motor vehicle.

The invention is applicable, in particular, to headlamps for a motor vehicle.

TECHNOLOGICAL BACKGROUND TO THE INVENTION

A lighting device for a motor vehicle comprises, in the manner known by the person skilled in the art:
- a housing;
- a light module arranged inside said housing;
- a control device for controlling the electrical supply to the light module, comprising a female connector mounted outside said housing;
- a connection harness connected to said light module and comprising a male connector designed to be connected to said female connector of said control device so as to connect said control device electrically to said light module.

The control device is manually assembled in the housing of the lighting device by an operator.

A drawback of this prior art is that the assembly is complicated since the operator has to push the control device into the housing from the outside with one hand, hold the connection harness inside the housing with the other hand and screw the control device to the housing at the same time. It is not possible to prefix the control device since said control device has to be replaceable and thus is not able to be fixed permanently.

In this context, the present invention aims to remedy the aforementioned drawback.

GENERAL DESCRIPTION OF THE INVENTION

To this end, the invention proposes a lighting device for a motor vehicle, said lighting device comprising:
- a housing;
- a light module arranged inside said housing;
- a control device designed to control the electrical supply to said light module, comprising a female connector mounted outside said housing;
- a connection harness connected to said light module and comprising a male connector designed to be connected to said female connector of said control device so as to connect said control device electrically to said light module,
- characterized in that said housing comprises:
- an orifice for the passage of said connection harness from the inside to the outside of said housing; and
- at least two ribs defining a receiver to receive and lock said male connector in position on said housing.

Thus, as will be seen in detail hereinafter, the invention prevents the operator from having to hold the connection harness with one hand. The connection harness holds itself. In this manner, one of the assembly movements is eliminated. The hands of the operator are thus free to carry out the assembly of the control device in the housing. This enables, on the one hand, time to be gained during the assembly and thus the productivity to be increased and, on the other hand, the ergonomics to be improved for the operator. The operator no longer adopts a poor posture.

According to the non-limiting embodiments, the lighting device may further comprise one or more additional features, including the following:

According to a non-limiting embodiment, said at least two ribs extend in said orifice and define a sub-orifice for the passage of said connection harness, once said male connector is locked in position in the receiver.

According to a non-limiting embodiment, said sub-orifice has a width which is substantially equal to or less than the width of said connection harness.

According to a non-limiting embodiment, said at least two ribs extend on either side of said orifice, defining a space therebetween in order to permit the passage of the connection harness from the inside of said housing when mounting said male connector on said housing.

According to a non-limiting embodiment, said housing comprises a network of ribs set back from said orifice, designed to define with said at least two ribs in the orifice said receiver for receiving said male connector.

According to a non-limiting embodiment, said network of ribs comprises:
- primary ribs defining said receiver;
- at least one secondary rib designed to fix the remainder of the network of ribs to the housing.

According to a non-limiting embodiment, said primary ribs are oriented in different directions so as to lock said male connector in position in said directions.

According to a non-limiting embodiment, each primary rib comprises a stepped profile with:
- an oblique slope to force the centering of said male connector in said receiver;
- a projection to lock said male connector in abutment;
- a plate serving as a support for said male connector on said housing.

According to a non-limiting embodiment, said housing further comprises at least one retaining clip designed to retain the connection harness in position.

According to a non-limiting embodiment, said control device is pushed onto said housing to connect said female connector to said male connector.

According to a non-limiting embodiment, a light source is a light source having a semi-conductor.

According to a non-limiting embodiment, said light source having a semi-conductor forms parts of a light emitting diode.

According to a non-limiting embodiment, said lighting device is a headlamp.

According to a non-limiting embodiment, said housing comprises a part for receiving the control device, said receiving part comprising said orifice for the passage of said connection harness and said at least two ribs defining said receiver in order to receive and lock said male connector in position on said housing.

BRIEF DESCRIPTION OF THE FIGURES

The invention and its various applications will be understood more clearly by reading the following description and by examining the accompanying figures.

FIG. 4b shows the part of the housing of FIG. 3 cooperating with a male connector according to a non-limiting embodiment;

DESCRIPTION OF EMBODIMENTS OF THE INVENTION

Figure 1:
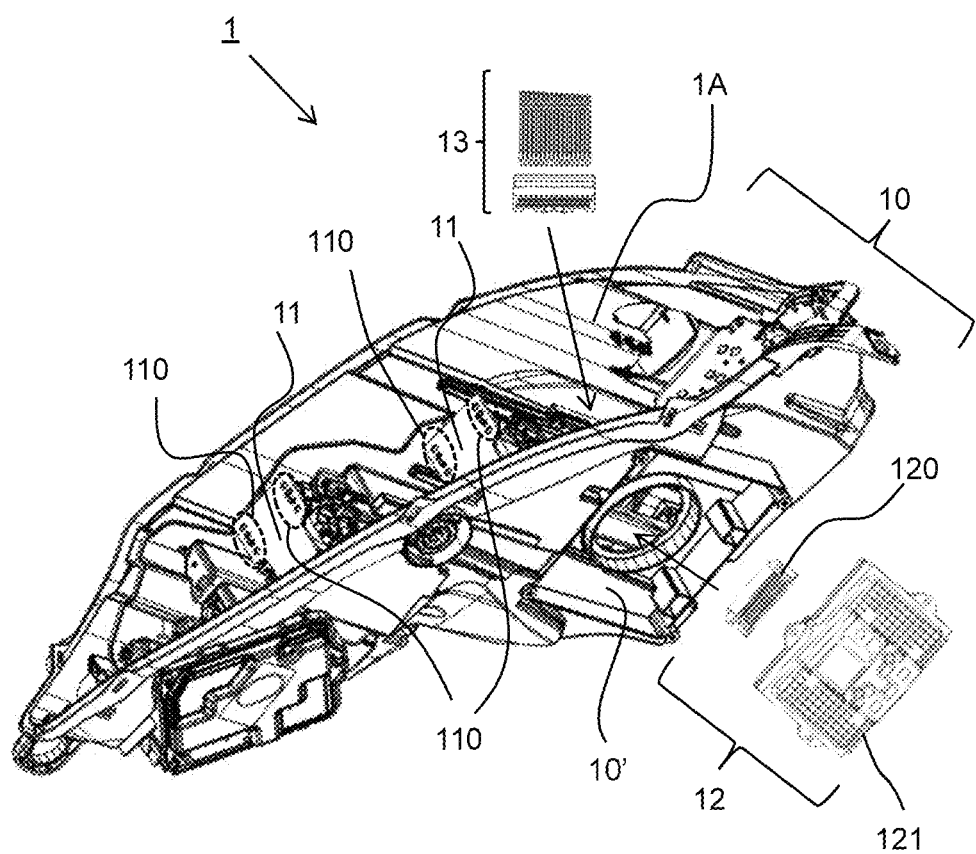
FIG. 1 shows a lighting device according to a non-limiting embodiment of the invention, said lighting device comprising a housing and a control device.

Elements which are identical in terms of structure or function and which appear in the various figures retain the same reference numerals unless specified to the contrary.

The lighting device 1 for a motor vehicle according to the invention is described with reference to FIGS. 1 to 9.

By "motor vehicle" is understood any type of motorized vehicle.

In a non-limiting embodiment, the lighting device 1 is an illuminating and/or signalling device. In a non-limiting variant, the illuminating and/or signalling device is a headlamp for a motor vehicle.

The lighting device 1 is designed to provide a specific photometric function. In the non-limiting embodiments, the photometric function is:
  a so-called "high beam" photometric function to produce a high beam; and/or
  a so-called "low beam" photometric function to produce, for example, a low beam.

In a non-limiting embodiment illustrated in FIG. 1, the lighting device 1 comprises:
  a housing 10;
  a light module 11;
  a control device 12 designed to control the electrical supply to the light module 11;
  a connection harness 13 connected to said light module 11.

In the non-limiting example illustrated in FIG. 1, the lighting device 1 comprises two light modules 11.

The elements of the light module 1 are described in detail below.

Light Module 11

The light module 11 is illustrated in FIG. 1.

The light module 11 is arranged inside the housing 10. The light module is designed to produce a light beam.

Said light module 11 comprises:
  at least one light source 110 designed to produce light rays;
  an optical module (not illustrated) designed to cooperate with said light rays of said at least one light source 110 so as to produce the light beam.

In a non-limiting embodiment, the light source is a light source having a semi-conductor.

In a non-limiting embodiment, the light source having a semi-conductor forms part of a light emitting diode.

By "light emitting diode" is understood any type of light emitting diode, whether in the non-limiting examples of LEDs ("Light Emitting Diode"), an OLED ("Organic LED") or an AMOLED ("Active Matrix Organic LED") or even a FOLED ("Flexible OLED"). In a non-limiting embodiment, the optical module comprises a reflector and/or a lens and/or a light guide.

Control Device 12

Figure 2:
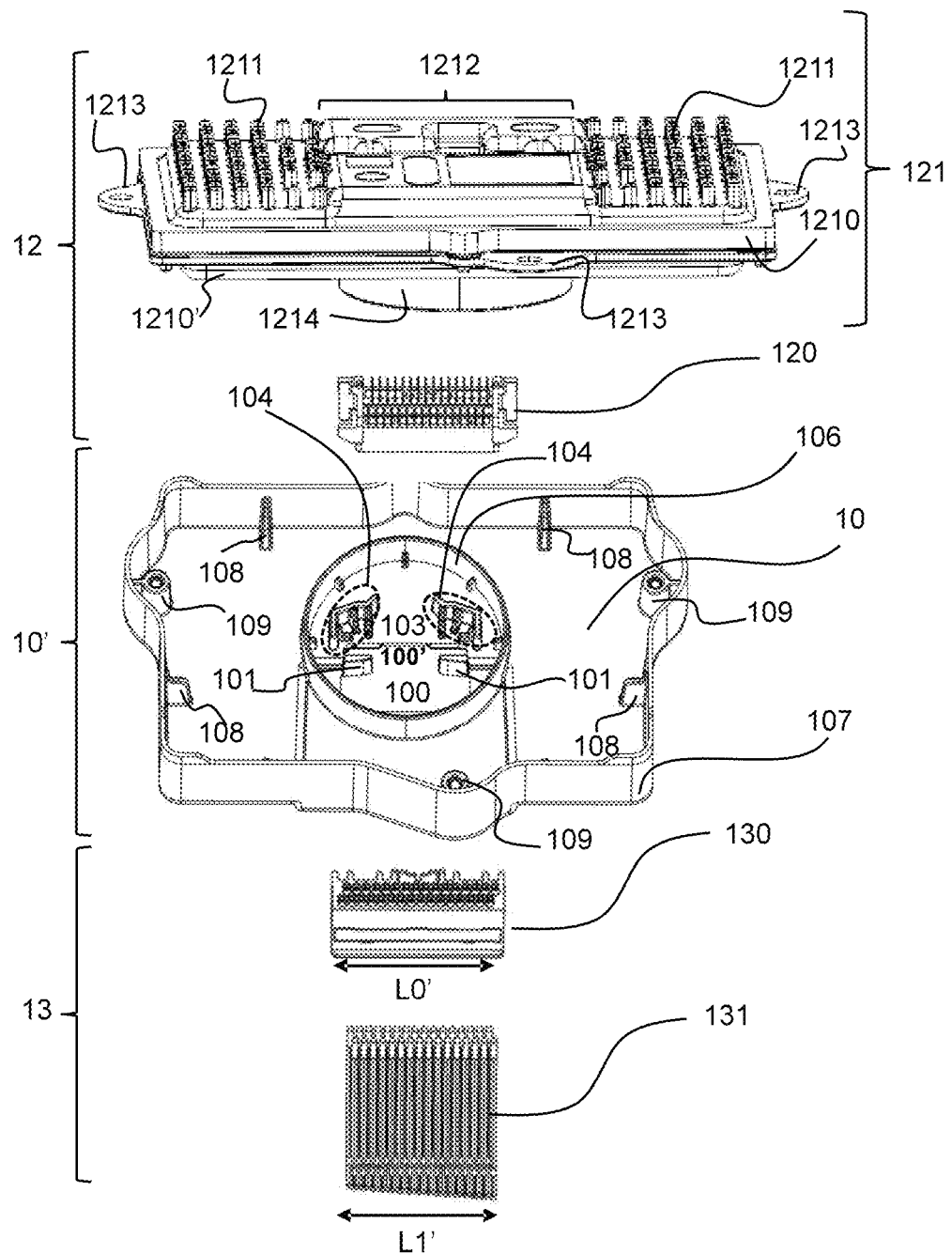
FIG. 2 shows an exploded perspective view of a part of the housing of the lighting device and of the control device of FIG. 1, according to a non-limiting embodiment.
Figure 3:
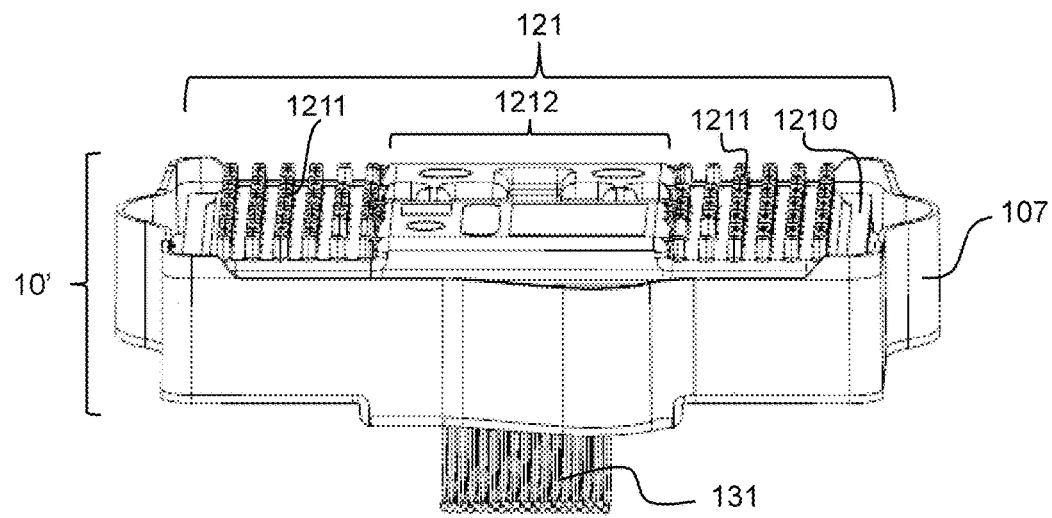
FIG. 3 shows a view from the side and in perspective of the part of the housing in which the control device of FIG. 2 is mounted, according to a non-limiting embodiment.

The control device 12 is illustrated in FIGS. 1 to 3.

The control device is designed to control the electrical supply to the light module 11, in particular the light sources 110 thereof.

As illustrated in FIG. 3, the control device is designed to be housed in a part 10' of the housing 10 of the lighting device 1.

The control device 12 comprises:
  an electronic control component (not illustrated in the figures);
  a female connector 120 mounted outside the housing 10;
  a heatsink 121 which also serves as a protective housing.

Electronic Control Component

In a non-limiting embodiment, the electronic control component is a DC/DC converter. In a further non-limiting embodiment, the electronic control component comprises one or more transistors. In a non-limiting example, the transistor is a MOSFET. The electronic control component is arranged on an electronic support housed entirely in the heatsink 121. In a non-limiting embodiment, the electronic support is a printed circuit board PCBA ("Printed Circuit Board Assembly"). The electronic support comprises a plurality of electronic components, including the electronic control component. These electronic components generate heat during the operation thereof. This heat is discharged from the control device 12 by the heatsink 121.

Female Connector 120

The female connector 120 is designed to connect the control device 12 electrically to the light module 11. This female connector 120 is designed to cooperate with a male connector 130 of the connection harness 13.

Heatsink 121

The heatsink 121 is illustrated in FIGS. 1 to 3.

The heatsink is designed to dissipate the heat discharged by the control device 12. The heatsink 121 forms a housing. The heatsink encloses the electronic support (not illustrated), the electronic control component being arranged thereon, in particular. The heatsink thus protects the electronic support and its electronic components from dust and the penetration of liquid, such as water. To this end, the heatsink 121 comprises a part 1212 which is configured as a function of the electronic components of the control device 12, as illustrated in FIGS. 2 and 3.

In a non-limiting embodiment, the heatsink 121 is made of aluminium. It is a lightweight, inexpensive material and a good dissipator of heat. In a further non-limiting embodiment, the heatsink 121 is produced in a thermoplastic material which is designed to dissipate heat.

As illustrated in FIG. 2, the heatsink 121 comprises:
  a base body 1210;
  a cap 1210';
  at least one fixing lug 1213;
  a primary sealing flange 1214.

In a non-limiting embodiment, the heatsink 121 further comprises protuberances 1211.

The cap 1210' cooperates with the base body 1210 so as to form the housing of the heatsink 121.

Fixing lugs 1213 permit the passage of fixing means, such as threaded rods or screws for the fixing of the heatsink 121 to said part 10' of the housing 10.

The protuberances 1211 permit the heat exchange surface with an airflow to be increased. In the non-limiting embodiment illustrated in FIGS. 1 to 3, the protuberances 1211 are pins. In a further non-limiting embodiment the protuberances 1211 are fins.

In a non-limiting embodiment, the protuberances 1211 are arranged on one side of the base body 1210 opposing the side on which the primary sealing flange 1214 is arranged.

As illustrated in FIG. 2, the primary sealing flange 1214 extends from the cap 1210'. The primary sealing flange is designed to be inserted into a secondary sealing flange 106 of the housing 10.

Connection Harness 13

The connection harness 13 is illustrated in FIG. 2.

The connection harness 13 is designed to be connected to the light module 11. The connection harness is thus designed to connect the control device 12 electrically to the light module 11.

The connection harness 13 comprises:
 a male connector 130 designed to be connected to the female connector 120 of the control device 12 so as to connect the control device 12 electrically to the light module 11;
 connecting wires 131.

In a non-limiting embodiment, the male connector 130 is clipped to the female connector 120. The connecting wires 131 are designed to connect the male connector 130 to an electric power source of the motor vehicle to the light module(s) 11 and to a control unit of the motor vehicle (not illustrated). The connecting wires 131 thus permit the control device 12 to control the supply of power to light sources of the light module 11 as a function of control commands generated by the control unit of the motor vehicle.

Housing 10

The housing 10 is illustrated in FIG. 1.

The housing is designed to:
 be housed in a receiver provided in the motor vehicle;
 receive the light module 11 and the control device 12 of the light module 1.

Figure 6:
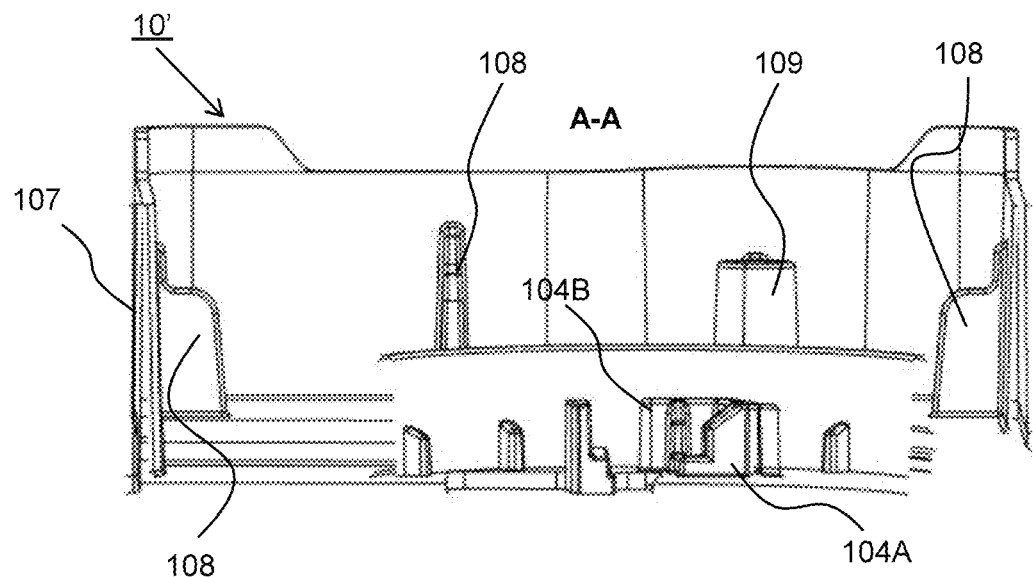
FIG. 6 shows a sectional view of the part of the housing along the axis A-A of FIG. 4A, said part of the housing comprising at least one rib.
Figure 7:
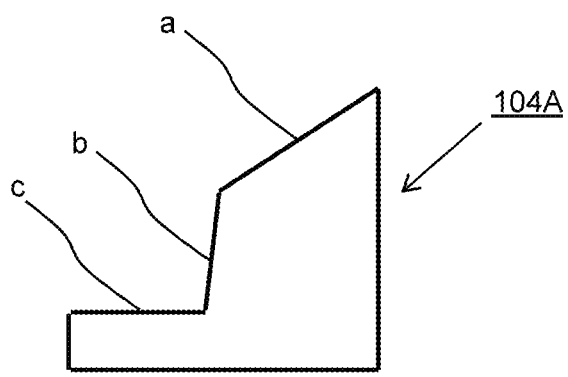
FIG. 7 shows a close-up profile of the rib of the part of the housing of FIG. 6.
Figure 8:
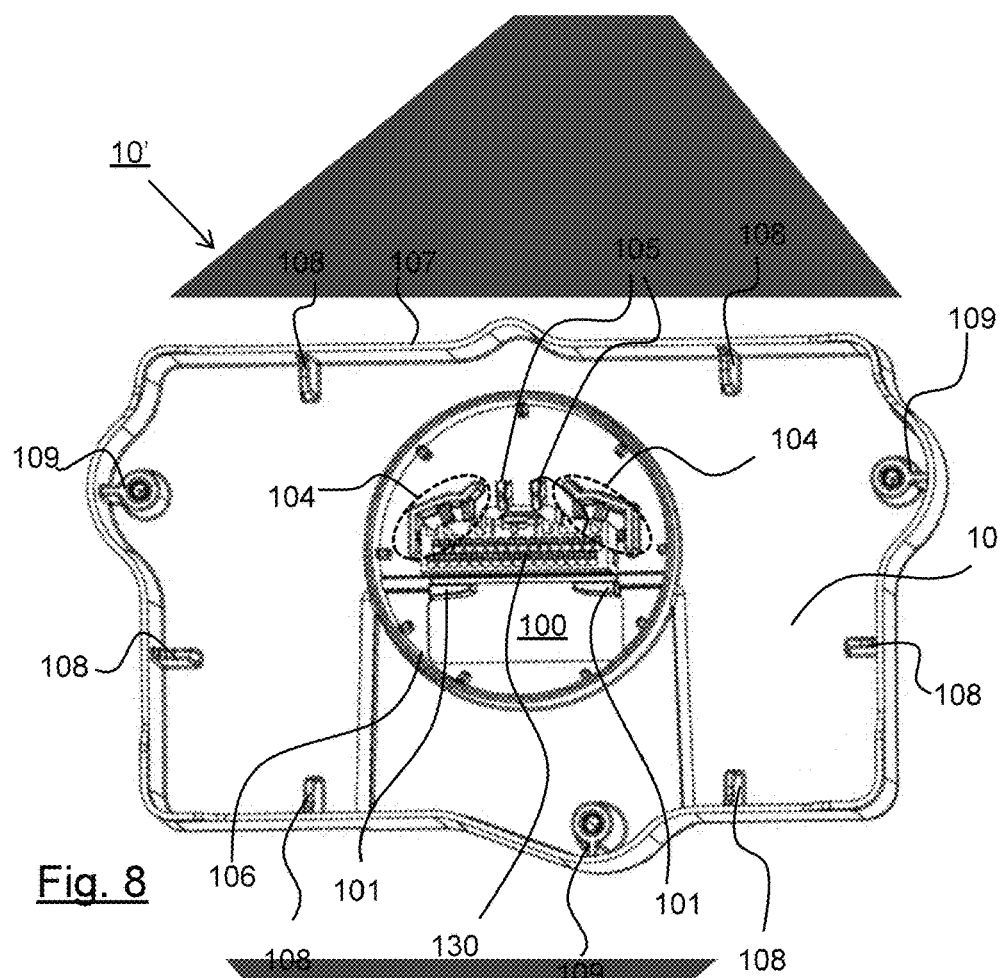
FIG. 8 shows a plan view of the part of the housing of FIG. 3 cooperating with a male connector, according to a second non-limiting embodiment.
Figure 9:
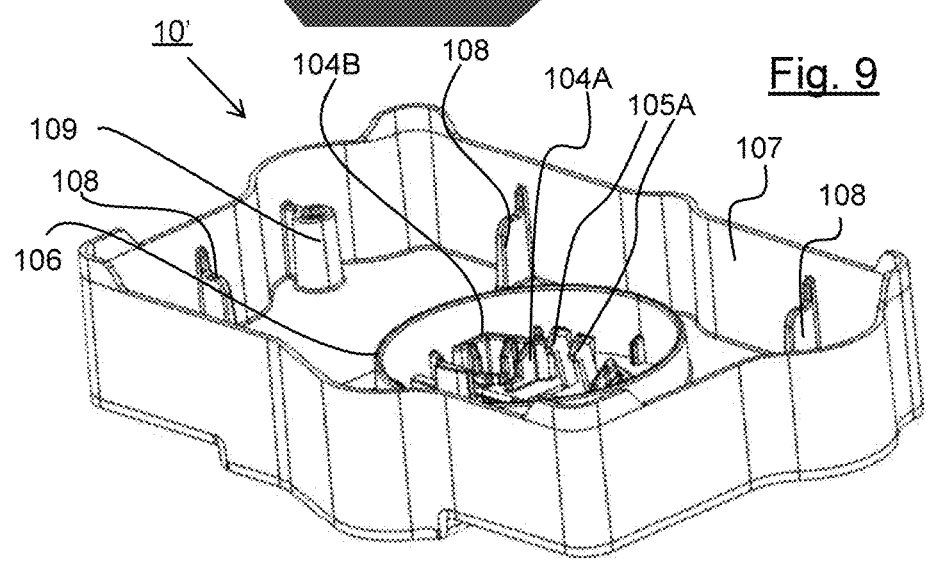
FIG. 9 shows a perspective view of the part of the housing of FIG. 8.

The housing 10 is illustrated in a first non-limiting embodiment in FIGS. 2 to 7 and according to a second non-limiting embodiment in FIGS. 8 and 9.

As illustrated in FIGS. 1 to 9, the housing 10 comprises a part 10' designed to receive the control device 12. This part 10' is also called the receiving part 10' in the remainder of the description.

In a non-limiting embodiment, the receiving part 10' is produced in the same material as the remainder of the housing 10 during the same manufacturing operation, for example a moulding operation in a non-limiting embodiment.

In a non-limiting embodiment illustrated in FIGS. 2 to 6 and 8-9, the housing 10 (in particular the receiving part 10') comprises:
 a secondary sealing flange 106 substantially centred in said receiving part 10';
 an edge 107;
 at least one support stud 108;
 at least one fixing shaft 109.

The secondary sealing flange 106 is designed to provide the seal of the control device 12 with the receiving part 10' of the housing 10. This secondary sealing flange 106 surrounds the orifice 100, the sub-orifice 100', the receiver 103, the ribs 101 and the network of ribs 104. The secondary sealing flange is designed to be nested around the primary sealing flange 1214 of the control device 12.

As illustrated in FIG. 3, the edge 107 is designed to receive the control device 12. The edge thus encompasses the control device 12 when said control device is positioned on the receiving part 10'. In a non-limiting embodiment, the edge 107 is of substantially rectangular shape.

Said at least one support stud 108 is designed to receive and support the control device 12. In the non-limiting example illustrated, there are six support studs 108.

Said at least one fixing shaft 109 is designed to be placed opposite one of the fixing lugs 1213 of the principal body 1210 of the heatsink 121. Fixing means, such as the threaded rod or the screw, are thus designed to fix the control device 12 to the receiving part 10' of the housing 10 via said at least one fixing shaft 109 and the associated fixing lug 1213. In the non-limiting embodiment illustrated, there are three fixing shafts 109.

The housing 10 (in particular the receiving part 10') further comprises:
 an orifice 100;
 at least two ribs 101, 104.

The orifice 100 is suitable for the passage of the connection harness 13 from the inside to the outside of the housing 10.

Figure 4A:
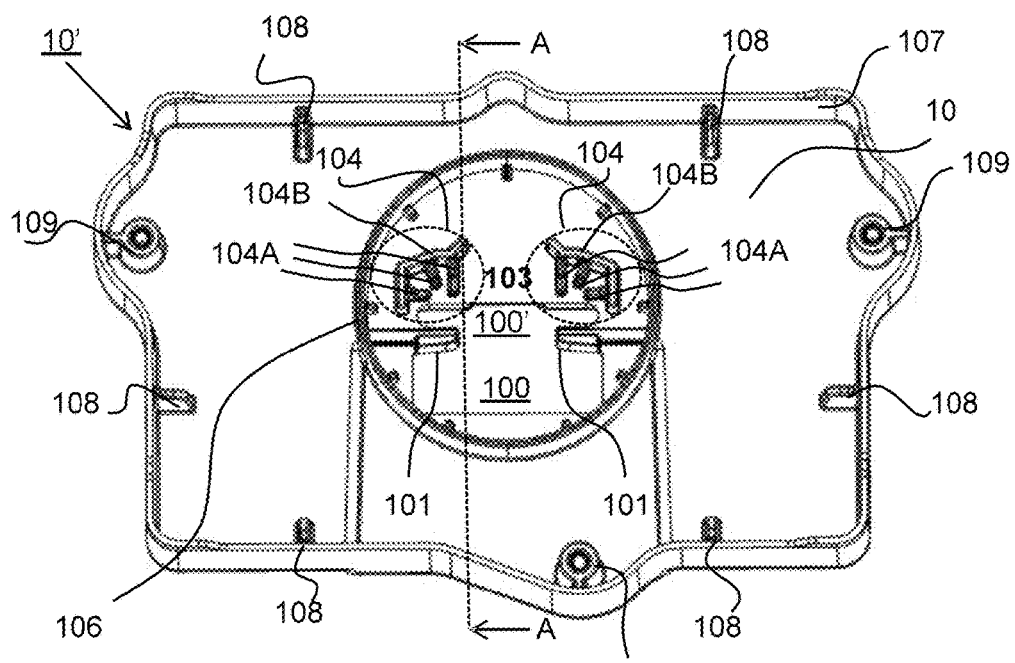
FIG. 4a shows a plan view of the inside of the part of the housing of FIG. 2, according to a non-limiting embodiment.
Figure 5A:
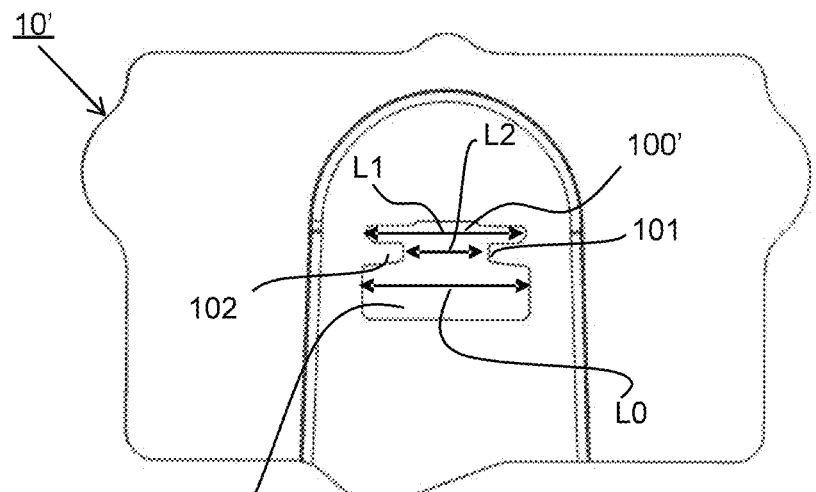
FIG. 5a shows a view from below of the part of the housing of FIG. 3, according to a non-limiting embodiment.

As illustrated in FIG. 4b or 5a, the orifice 100 has a width L0. This width L0 is substantially greater than or equal to the width L0' (illustrated in FIG. 2) of the male connector 130 so as to permit said passage of the male connector into the orifice 100.

Said at least two ribs 101, 104 define a receiver 103 (illustrated in FIG. 2) to receive and lock said male connector 130 in position on the housing 10.

Figure 5B:
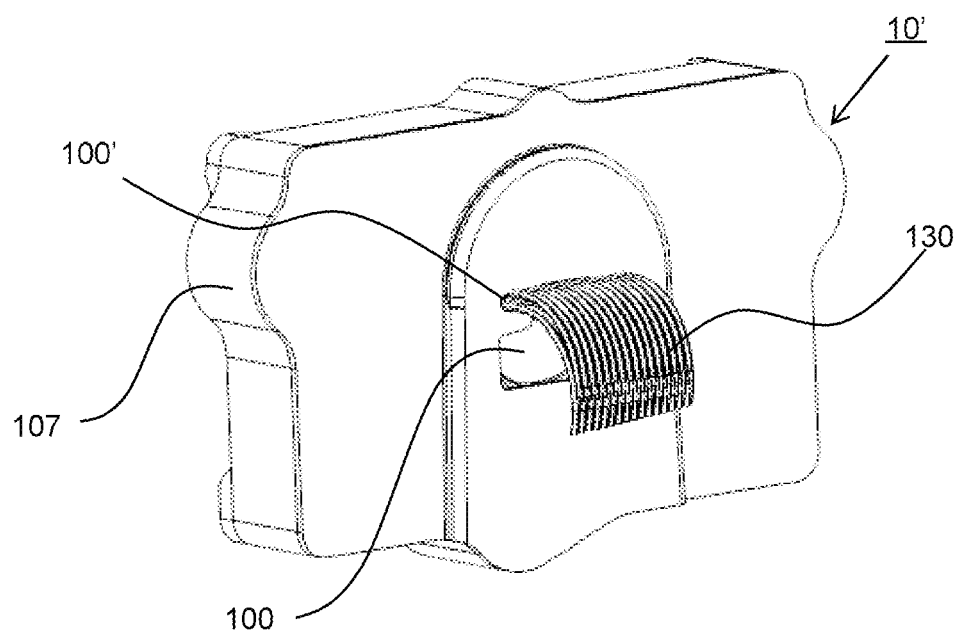
FIG. 5b shows a connection harness emerging from the housing of FIG. 3, according to a non-limiting embodiment.

In a non-limiting embodiment illustrated in FIGS. 2, 4a, 5b, two ribs 101 extend in the orifice 100 and define a sub-orifice 100' for the passage of the connection harness 13 once the male connector 130 is locked in position in the receiver 103. The two ribs 101 permit the connecting wires 131 to be wedged in said sub-orifice 101'.

In a non-limiting embodiment as illustrated in FIG. 5a, the sub-orifice 100' has a width L1. The width L1 is substantially equal to or less than the width L1' (illustrated in FIG. 2) of the connection harness 13.

Moreover, the width L1 of the sub-orifice 100' is less than the width L0' of the male connector 130. In this manner, the male connector 130 is locked by the sub-orifice 100' in position in the receiver 103 once the male connector 130 is displaced toward said sub-orifice 100'. The male connector 130 is locked in position in all directions X, Y and Z by the two ribs 101 and the network of ribs 104.

As illustrated in FIG. 5a, in a non-limiting embodiment, the two ribs 101 extend on either side of the orifice 100, defining a space L2 therebetween to permit the passage of the connection harness 13 (in particular the connecting wires 131) from the inside of said housing 10 when mounting said male connector 130 on said housing 10. The width of this space L2 is less:
 than the width L0 of the orifice 100;
 than the width L1 of the sub-orifice 100';
 than the width L1' of the connection harness 13.

Thus during assembly the operator has to pivot the connection harness 13 about its principal axis to pass said connection harness through the space L2 in the direction of the sub-orifice 100'. In this manner, it is possible to position the male connector 130 in the receiver 103.

It will be noted that the ribs 101 are configured to be sufficiently small to permit the connection harness 13 to pass through and are configured to be sufficiently large for the manufacture thereof, by an injection-moulding process in a non-limiting example.

As illustrated in FIGS. 2, 4a, 4b, 8 and 9 in a non-limiting embodiment, the housing 10 comprises a network of ribs 104 set back from the orifice 100 and designed to define with said two ribs 101 in the orifice 100 said receiver 103 for receiving said male connector 13.

In a non-limiting embodiment, the network of ribs 104 comprises:
primary ribs 104A defining the receiver 103;
at least one secondary rib 104B designed to fix the remainder of the network of ribs 104 to the housing 10.

As illustrated in FIG. 4a, the network of ribs 104 is thus divided into two sub-networks of ribs respectively comprising at least one primary rib 104A and an associated secondary rib 104B. Each sub-network of ribs is respectively located opposite each rib 101, the sub-network of ribs and the rib 101 being arranged on each side of the sub-orifice 100'.

In a non-limiting embodiment illustrated in FIG. 4b, the network of ribs comprises six primary ribs 104A and two secondary ribs 104B. Three primary ribs 104A extend from a secondary rib 104B. Thus in the non-limiting example illustrated, each sub-network of ribs comprises three primary ribs 104A and a secondary rib 104B.

In a non-limiting embodiment illustrated in FIG. 4b, the primary ribs 104A defining said receiver 103 are oriented in different directions so as to lock said male connector 130 in position in said directions.

In an embodiment illustrated in FIGS. 6 and 7, each primary rib 104A defining said receiver 103 comprises a stepped profile with:
an oblique slope a in order to force the centering of said male connector 130 in said receiver 103;
a projection b in order to lock said male connector 130 in abutment;
a plate c serving as a support for said male connector 130 on said housing 10.

It is thus possible to guarantee good mechanical strength of the male connector 130 in the receiver 103.

It will be noted that the primary ribs 104A have a shape which is adapted to the specific shape of the male connector 130.

The secondary ribs 104B permit good mechanical strength to be obtained.

In the second non-limiting embodiment of the housing 10 (in particular the receiving part 10' thereof), illustrated in FIGS. 8 and 9, the housing 10 further comprises at least one retaining clip 105 in order to retain the connection harness 13 in position in the receiver 103. In the non-limiting example illustrated, there are two retaining clips 105. The retaining clips 105 are arranged between the two sub-networks of ribs described above. In a non-limiting embodiment illustrated in FIG. 9, each retaining clip 105 comprises a head 105A designed to rest on the male connector 130 of the connection harness 13 so as to retain it in position. The retaining clips 105 permit the connection harness 13 to be held in position in an improved manner in the direction Z.

Mounting of the Connection Harness 13 in the Housing 10

In a first mounting step, the operator moves the connection harness 13 into the orifice 100 via the inside of the housing 10. A portion of the connecting wires 131 of the connection harness 13 extends beyond the orifice 100 so as to be able to engage, in a second mounting step, said connection harness 13 in the sub-orifice 100' delimited by the two ribs 101. The male connector 130 of the connection harness 13 is then pushed by the operator into the receiver 103. The operator presses against the male connector 130 in order to lock it in position in the housing 10. The male connector 130 is thus retained in said housing 10 due to the ribs 101, 104. The operator is thus able to release the connection harness 13. This frees the hands of the operator. The operator no longer needs to retain the connection harness 13 manually. This connection harness is no longer able to move freely. In this position, the connecting wires 131 emerge from the sub-orifice 100' on the inside 1A (interior illustrated in FIG. 1) of the housing 10 as illustrated in FIG. 5b. In a subsequent step it is then possible for the operator to push the control device 12 with one hand onto the housing 10, in particular into the receiving part 10' of said housing 10 to connect its female connector 120 to the male connector 130 of the connection harness 13, and at the same time with the other hand to fix the control device 12 onto the housing 10, in particular in the receiving part 10', by means of screws in the fixing lugs 1213 and the associated fixing shafts 109.

Naturally, the description of the invention is not limited to the embodiments described above.

Thus in a further non-limiting embodiment, the network of ribs 104 may comprise a single secondary rib 104B which fixes the assembly of the primary ribs 104A to the housing 10 (in this case the six primary ribs 104A).

Thus in a further non-limiting embodiment, the lighting device 1 may comprise more than two light modules 11.

Thus the invention described has, in particular, the following advantages:
it improves the ergonomics for the operator when assembling the control device 12 on the housing 10. It is thus not necessary for said operator to hold the connection harness 13 during this assembly procedure;
it permits an increase in the productivity of the operator when assembling the control device 12 on the housing 10;
it permits easy access to the control device 12;
it facilitates the dismantling of the control device 12 when said control device 12 has to be replaced.

The invention claimed is:

1. Lighting device for a motor vehicle, said lighting device comprising:
a housing;
a light module arranged inside said housing;
a control device designed to control an electrical supply to said light module, comprising a female connector mounted outside said housing;
a connection harness connected to said light module and comprising a male connector designed to be connected to said female connector of said control device so as to connect said control device electrically to said light module,
wherein said housing comprises:
an orifice for a passage of said connection harness from the inside to the outside of said housing; and
at least two ribs defining a receiver to receive and lock said male connector in position on said housing.

2. Lighting device according to claim 1, wherein said at least two ribs extend in said orifice and define a sub-orifice for the passage of said connection harness, once said male connector is locked in position in the receiver.

3. Lighting device according to claim 2, wherein said sub-orifice has a width which is substantially equal to or less than the width of said connection harness.

4. Lighting device according to claim 1, wherein said at least two ribs extend on either side of said orifice defining a space therebetween in order to permit the passage of the connection harness from the inside of said housing when mounting said male connector on said housing.

5. Lighting device according to claim 1, wherein said housing comprises a network of ribs set back from said orifice, designed to define with said at least two ribs in the orifice said receiver for receiving said male connector.

6. Lighting device according to claim 5, wherein said network of ribs comprises:
primary ribs defining said receiver;
at least one secondary rib designed to fix the remainder of the network of ribs to the housing.

7. Lighting device according to claim 6, wherein said primary ribs are oriented in different directions so as to lock said male connector in position in said directions.

8. Lighting device according to claim 6, wherein each primary rib comprises a stepped profile with:
an oblique slope to force the centering of said male connector in said receiver;
a projection to lock said male connector in abutment;
a plate serving as a support for said male connector on said housing.

9. Lighting device according to claim 1, wherein said housing further comprises at least one retaining clip designed to retain the connection harness in position.

10. Lighting device according to claim 1, wherein said control device is pushed onto said housing to connect said female connector to said male connector.

11. Lighting device according to claim 1, wherein a light source is a light source having a semi-conductor.

12. Lighting device according to claim 11, wherein said light source having a semi-conductor forms part of a light emitting diode.

13. Lighting device according to claim 1, wherein said lighting device is a headlamp.

14. Lighting device according to claim 2, wherein said sub-orifice has a width which is substantially equal to or less than the width of said connection harness.

15. Lighting device according to claim 2, wherein said at least two ribs extend on either side of said orifice defining a space therebetween in order to permit the passage of the connection harness from the inside of said housing when mounting said male connector on said housing.

16. Lighting device according to claim 2, wherein said housing comprises a network of ribs set back from said orifice, designed to define with said at least two ribs in the orifice said receiver for receiving said male connector.

17. Lighting device according to claim 7, wherein each primary rib comprises a stepped profile with:
an oblique slope to force the centering of said male connector in said receiver;
a projection to lock said male connector in abutment;
a plate serving as a support for said male connector on said housing.

18. Lighting device according to claim 2, wherein said housing further comprises at least one retaining clip designed to retain the connection harness in position.

19. Lighting device according to claim 2, wherein said control device is pushed onto said housing to connect said female connector to said male connector.

20. Lighting device according to claim 2, wherein a light source is a light source having a semi-conductor.

* * * * *